United States Patent
Wang et al.

(10) Patent No.: US 8,054,673 B2
(45) Date of Patent: Nov. 8, 2011

(54) THREE DIMENSIONALLY STACKED NON VOLATILE MEMORY UNITS

(75) Inventors: Xuguang Wang, Eden Prairie, MN (US); Yong Lu, Rosemount, MN (US); Hai Li, Eden Prairie, MN (US); Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 208 days.

(21) Appl. No.: 12/425,084

(22) Filed: Apr. 16, 2009

(65) Prior Publication Data

US 2010/0265749 A1    Oct. 21, 2010

(51) Int. Cl.
     *G11C 11/00*      (2006.01)
     *G11C 11/14*      (2006.01)
     *G11C 11/22*      (2006.01)
     *H01L 23/52*      (2006.01)
     *H01L 23/02*      (2006.01)

(52) U.S. Cl. ........ 365/148; 365/145; 365/163; 365/171; 257/211; 257/686; 257/E21.614; 257/E23.085

(58) Field of Classification Search .................. 257/211; 365/148
See application file for complete search history.

(56) References Cited

U.S. PATENT DOCUMENTS

| | | | | |
|---|---|---|---|---|
| 6,680,499 B2 * | 1/2004 | Kumura et al. | | 257/295 |
| 6,828,689 B2 | 12/2004 | Madurawe | | |
| 6,937,505 B2 * | 8/2005 | Morikawa | | 365/158 |
| 7,038,261 B2 * | 5/2006 | Horii | | 257/295 |
| 7,309,885 B2 * | 12/2007 | Park et al. | | 257/211 |
| 7,345,899 B2 * | 3/2008 | Nirschl et al. | | 365/63 |
| 7,453,111 B2 * | 11/2008 | Ryoo et al. | | 257/295 |
| 7,453,716 B2 * | 11/2008 | Kim et al. | | 365/148 |
| 7,479,405 B2 * | 1/2009 | Park et al. | | 438/95 |
| 7,642,622 B2 * | 1/2010 | Yi et al. | | 257/613 |
| 2006/0028861 A1 * | 2/2006 | Han et al. | | 365/154 |
| 2006/0118913 A1 | 6/2006 | Yi | | |
| 2006/0120148 A1 | 6/2006 | Kim | | |
| 2007/0034908 A1 * | 2/2007 | Cho et al. | | 257/260 |
| 2007/0268742 A1 | 11/2007 | Liu | | |
| 2008/0038879 A1 | 2/2008 | Kurjanowicz | | |
| 2008/0106938 A1 | 5/2008 | Ishii | | |

(Continued)

OTHER PUBLICATIONS

Jung et al., Highly Cost Effective and High Performance 65nm $S^3$ (Stacked Single-Crystal Si) SRAM Technology . . . , 2005 Symposium on VLSI Technology Digest of Technical Papers, pp. 220-221.
PCT Search Report and Written Opinion dated Sep. 20, 2010.

*Primary Examiner* — Son Mai
(74) *Attorney, Agent, or Firm* — Campbell Nelson Whipps LLC

(57) ABSTRACT

A memory unit including a first transistor spanning a first transistor region in a first layer of the memory unit; a second transistor spanning a second transistor region in a second layer of the memory unit; a first resistive sense memory (RSM) cell spanning a first memory region in a third layer of the memory unit; and a second RSM cell spanning a second memory region in the third layer of the memory unit, wherein the first transistor is electrically coupled to the first RSM cell, and the second transistor is electrically coupled to the second RSM cell, wherein the second layer is between the first and third layers, wherein the first and second transistor have an transistor overlap region, and wherein the first memory region and the second memory region do not extend beyond the first transistor region and the second transistor region.

14 Claims, 12 Drawing Sheets

U.S. PATENT DOCUMENTS

| | | |
|---|---|---|
| 2008/0203443 A1 | 8/2008 | Wilson |
| 2008/0203503 A1 | 8/2008 | Asaq |
| 2009/0039407 A1 | 2/2009 | Vora |
| 2009/0067212 A1* | 3/2009 | Shimizu ........................ 365/148 |
| 2009/0185407 A1* | 7/2009 | Park et al. ........................ 365/51 |
| 2009/0185410 A1 | 7/2009 | Huai |

* cited by examiner

THREE DIMENSIONALLY STACKED NON VOLATILE MEMORY UNITS

BACKGROUND

New types of memory have demonstrated significant potential to compete with commonly utilized types of memory. For example, non-volatile spin-transfer torque random access memory (referred to herein as "STRAM") and resistive random access memory (referred to herein as "RRAM") are both considered good candidates for the next generation of memory. The ability of STRAM and RRAM to more effectively compete with established memory types, such as FLASH memory (NAND or NOR) can be maximized by increasing the density at which memory units (a memory cell and its associated driving device) can be formed on a chip.

BRIEF SUMMARY

Disclosed herein is a memory unit including a first transistor spanning a first transistor region in a first layer of the memory unit; a second transistor spanning a second transistor region in a second layer of the memory unit; a first resistive sense memory (RSM) cell spanning a first memory region in a third layer of the memory unit; and a second RSM cell spanning a second memory region in the third layer of the memory unit, wherein the first transistor is electrically coupled to the first RSM cell, and the second transistor is electrically coupled to the second RSM cell, wherein the second layer is between the first and third layers, wherein the first and second transistor have an transistor overlap region, and wherein the first memory region and the second memory region do not extend beyond the first transistor region and the second transistor region.

Disclosed herein is RSM unit including a first transistor spanning a first transistor region in a first layer of the memory unit; a second transistor spanning a second transistor region in a second layer of the memory unit; and a RSM cell spanning a memory region in a third layer of the memory unit, wherein the first transistor is electrically coupled to the second transistor and the second transistor is electrically coupled to the RSM cell, wherein the second layer is between the first layer and the third layer, wherein the first transistor and the second transistor have an transistor overlap region, and wherein the memory region does not extend beyond the first and second transistor regions.

Also disclosed herein are methods of utilizing a RSM unit that include providing a RSM unit including a first transistor spanning a first transistor region in a first layer of the memory unit; a second transistor spanning a second transistor region in a second layer of the memory unit; and a RSM cell spanning a memory region in a third layer of the memory unit, wherein the first transistor is electrically coupled to the second transistor and the second transistor is electrically coupled to the RSM cell, wherein the second layer is between the first layer and the third layer, wherein the first transistor and the second transistor have an transistor overlap region, and wherein the memory region does not extend beyond the first and second transistor regions; and activating only the first or second transistor to determine the resistance state of the RSM cell.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
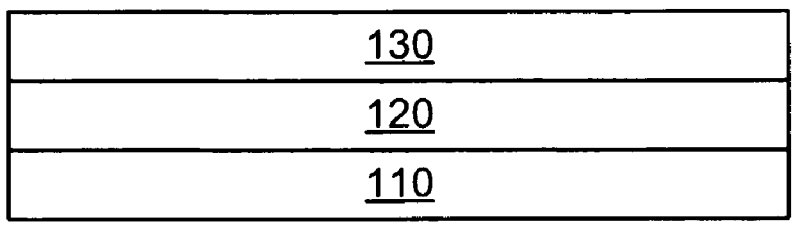
FIGS. 1A and 1B are schematic diagrams of exemplary STRAM cells.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, when an article depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

Non volatile memory cells, such as STRAM and RRAM require relatively large driving currents, for example, some STRAM cells require driving currents of about 400 microamps ($\mu$A). Commonly utilized metal-oxide-semiconductor field-effect transistors (MOSFETs) generally have driving capabilities of about 800 $\mu$A/micrometer ($\mu$m). Therefore, a MOSFET capable of providing this requisite driving current generally has to be about 0.5 $\mu$m.

Assuming currently available semiconductor fabrication techniques have a minimum dimension of 90 nm (F), the width of a useful MOSFET is about 5.6 F. Commonly utilized memory unit configurations generally have a single memory cell associated with a single transistor. Assuming a memory cell has dimensions of F×2 F and memory units generally require spacing between each memory unit of F, commonly utilized memory unit configurations have an area of (5.6 F+F)*(2 F+F+F), which equals about 26.4 $F^2$. When you compare the total area needed, 26.4 $F^2$ to the area of the memory cell alone, 2 $F^2$, it can be seen that in commonly utilized memory unit configurations, the transistor requires significantly more area than the memory cell and is the major cause of the relatively large area that is required for a single functional memory cell.

Memory units such as those disclosed herein offer alternative configurations for memory cells and transistors that utilize significantly less area and can therefore provide advantages in cost and efficiency. Disclosed memory units offer such advantages by either powering one memory cell with two smaller transistors or by changing the three dimensional configuration of a transistor and its associated memory cell by arranging two transistors in two vertically overlying layers and placing the two memory cells on a shared third layer above the two transistors. Various different configurations that can be utilized to obtain such advantages will be discussed herein. A calculation (similar to that above) of the area that is necessary for such configurations will be discussed with respect to each embodiment.

A "memory unit" as that term is used herein can refer to one or more memory cells that are electrically connected to one or more devices that can function to allow current to pass through the one or more memory cells. In an embodiment, a memory unit can include one memory cell electrically connected to two transistors. In an embodiment, the one memory cell can be electrically connected to one of the two transistors that is electrically connected to the other transistor. Such a configuration can be referred to as a single memory cell—double transistor configuration. In an embodiment, a memory unit can include a first memory cell that is electrically connected to a first transistor and a second memory cell that is electrically connected to a second transistor. Such a configuration can be referred to as a single memory cell—single transistor configuration.

A memory cell utilized in a memory device as described herein can include many different types of memory. Exemplary types of memory that can be utilized in devices disclosed herein include, but are not limited to non volatile memory such as, resistive sense memory (RSM) cells. A RSM cell is a memory cell having a changeable resistance that affords data storage using different resistance states of the RSM cell. Exemplary RSM cells include, but are not limited to, ferroelectric RAM (FeRAM or FRAM); magnetoresistive RAM (MRAM); resistive RAM (RRAM); phase change memory (PCM) which is also referred to as PRAM, PCRAM and C-RAM; programmable metallization cell (PMC) which is also referred to as conductive-bridging RAM or CBRAM; and spin torque transfer RAM, which is also referred to as STRAM.

Figure 1B:
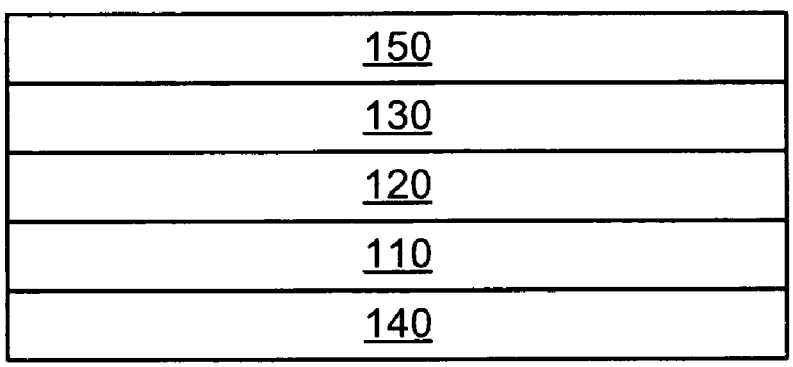

In embodiments, the RSM cell can be a STRAM cell. STRAM memory cells include a MTJ (magnetic tunnel junction), which generally includes two magnetic electrode layers separated by a thin insulating layer, which is also known as a tunnel barrier. An embodiment of a MTJ is depicted in FIG. 1A. The MTJ 100 in FIG. 1A includes a first magnetic layer 110 and a second magnetic layer 130, which are separated by an insulating layer 120. FIG. 1B depicts a MTJ 100 in contact with a first electrode layer 140 and a second electrode layer 150. The first electrode layer 140 and the second electrode layer 150 electrically connect the first magnetic layer 110 and the second magnetic layer 130 respectively to a control circuit (not shown) providing read and write currents through the magnetic layers. The relative orientation of the magnetization vectors of the first magnetic layer 110 and the second magnetic layer 130 can be determined by the resistance across the MTJ 100; and the resistance across the MTJ 100 can be determined by the relative orientation of the magnetization vectors of the first magnetic layer 110 and the second magnetic layer 130.

The first magnetic layer 110 and the second magnetic layer 130 are generally made of ferromagnetic alloys such as iron (Fe), cobalt (Co), and nickel (Ni) alloys. In embodiments, the first magnetic layer 110 and the second magnetic layer 130 can be made of alloys such as FeMn, NiO, IrMn, PtPdMn, NiMn and TbCo. The insulating layer 120 is generally made of an insulating material such as aluminum oxide ($Al_2O_3$) or magnesium oxide (MgO).

The magnetization of one of the magnetic layers, for example the first magnetic layer 110 is generally pinned in a predetermined direction, while the magnetization direction of the other magnetic layer, for example the second magnetic layer 130 is free to rotate under the influence of a spin torque.

Pinning of the first magnetic layer 110 may be achieved through, e.g., the use of exchange bias with an antiferromagnetically ordered material such as PtMn, IrMn and others.

Figure 1C:
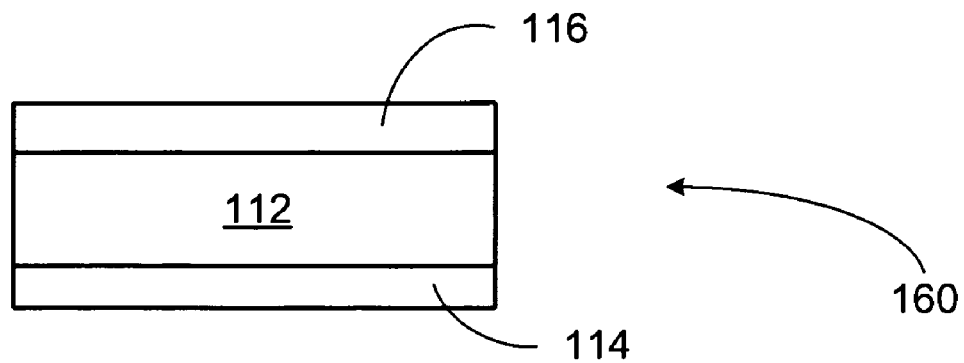
FIG. 1C is a schematic diagram of an exemplary RRAM cell.

In embodiments, the RSM cell can be a RRAM cell. FIG. 1C is a schematic diagram of an illustrative resistive random access memory (RRAM) cell 160. The RRAM cell 160 includes a medium layer 112 that responds to an electrical current or voltage pulse by altering an electrical resistance of the medium layer 112. This phenomenon can be referred to as the electrical pulse induced resistance change effect. This effect changes the resistance (i.e., data state) of the memory from one or more high resistance state(s) to a low resistance state, for example. The medium layer 112 is interposed between a first electrode 114 and the second electrode 116 and acts as a data storage material layer of the RRAM cell. The first electrode 114 and the second electrode 116 are electrically connected to a voltage source (not shown). The first electrode 114 and a second electrode 116 can be formed of any useful electrically conducting material such as, for example, a metal.

The material forming the medium layer 112 can be any known useful RRAM material. In embodiments, the material forming the medium layer 112 can include an oxide material such as, a metal oxide. In some embodiments, the metal oxide is a binary oxide material or complex metal oxide material. In other embodiments, the material forming the medium layer 112 can include a chalcogenide solid electrolyte material or an organic/polymer material.

The binary metal oxide material can be expressed as a chemical formula of $M_xO_y$. In this formula, the characters "M", "O", "x", and "y" refer to metal, oxygen, a metal composition ratio, and an oxygen composition ratio, respectively. The metal "M" may be a transition metal and/or aluminum (Al). In this case, the transition metal may be nickel (Ni), niobium (Nb), titanium (Ti), zirconium (Zr), hafnium (Hf), cobalt (Co), iron (Fe), copper (Cu) and/or chrome (Cr). Specific examples of binary metal oxides that may be used as the medium layer 112 include $CuO$, $NiO$, $CoO$, $ZnO$, $CrO_2$, $TiO_2$, $HfO_2$, $ZrO_2$, $Fe_2O_3$, and $Nb_2O_5$.

In embodiments, the metal oxide can be any useful complex metal oxide such as, for example, a complex oxide material having a formula $Pr_{0.7}Ca_{0.3}MnO_3$, or $SrTiO_3$, or $SiZrO_3$, or these oxides doped with Cr or Nb. The complex can also include $LaCuO_4$, or $Bi_2Sr_2CaCu_2O_8$. One example of a solid chalcogenide material is a germanium-selenide ($Ge_xSe_{100-x}$) containing a silver (Ag) component. One example of an organic material is Poly(3,4-ethylenedioxythiophene) (i.e., PEDOT).

The RSM cell can also include ferroelectric capacitors having structures similar to FIG. 1C using materials such as lead zirconate titanate (referred to as "PZT") or $SrBi_2Ta_2O_9$ (referred to as "SBT"). In such memory cells, an electrical current can be used to switch the polarization direction and the read current can detect whether the polarization is up or down. In such embodiments, a read operation is a destructive process, where the cell will lose the data contained therein, requiring a refresh to write data back to the cell.

Memory units as disclosed herein also include transistors. Generally, field-effect transistors (FETs) are utilized. All commonly utilized FETs have a gate, a drain, a source and a body (or substrate). The gate generally controls the opening and closing of the FET, similar to a physical gate. The gate permits electrons to flow through (when open) or blocks their passage (when closed) by creating or eliminating a channel between the source and the drain. Electrons flow from the source terminal towards the drain terminal when influenced by an applied voltage. The body or substrate is the bulk of the semiconductor in which the gate, source and drain lie.

In embodiments, memory units as disclosed herein can utilize metal-oxide-semiconductor field-effect transistors (MOSFETs). MOSFETs are generally composed of a channel of n-type or p-type semiconductor material and are respectively referred to as NMOSFETs or PMOSFETs (also commonly nMOS, pMOS). Embodiments can also utilize complimentary metal-oxide-semiconductor transistors ("CMOS" transistors). The transistors in a memory unit can, but need not be the same kind of transistors.

Figure 2A:
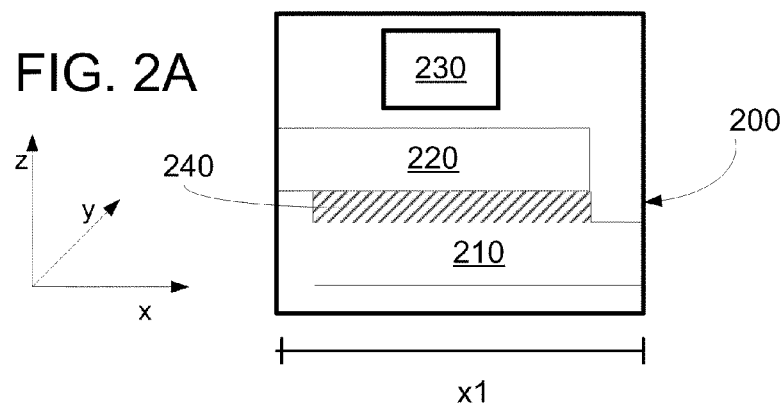
FIG. 2A is a schematic diagram of an embodiment of a memory unit as disclosed herein.

An embodiment of a memory unit as disclosed herein can be seen in FIG. 2A. The memory unit 200 in FIG. 2A includes a first transistor 210, a second transistor 220 and at least a first RSM cell 230. Generally, memory units as disclosed herein have a configuration that utilizes the height dimension, as depicted in FIG. 2A, the z-axis to decrease the width dimension, the x-axis as depicted in FIG. 2A. As seen in FIG. 2A, the second transistor 220 is positioned above the first transistor 210 and the at least first RSM cell 230 is positioned above the second transistor 220. The first transistor 210 and second transistor 220 overlap in the x-dimension, forming what is referred to as a transistor overlap region 240. The longer the transistor overlap region 240 is in the x-dimension, the less width the entire memory unit will require.

The first transistor 210 is located in a first layer of the memory unit; the second transistor 220 is located within a second layer of the memory unit and the first RSM cell 230 is located in a third layer of the memory unit. Generally, the second layer is between the first and third layers. A "layer" as that word is used with respect to the memory unit refers to a portion of the memory unit (generally taking up a portion of the memory unit in the direction of the z-axis as seen in FIG. 2A) that contains a component, such as the first transistor 210, the second transistor 230 or the first RSM cell 230.

Generally, all embodiments disclosed herein share the basic three layer and transistor overlap region configuration. Such a configuration saves space in either the width or length dimension (in FIG. 2A, the y- or x-axis) by stacking the components in the height dimension (the z-axis in FIG. 2A) and sharing at least a portion of the x-axis (or y-axis in some embodiments). The various embodiments disclosed herein will vary depending on whether the two transistors are the same size, whether they entirely overlap each other or only partially overlap, whether one or two memory cells are included and whether a memory cell is electrically connected to one or two transistors.

Memory unit disclosed herein make advantageous use of space because of the overlap (in the z-axis) of the two transistors, which are much larger in comparison to the RSM cells. A memory unit that includes two transistors and two associated RSM cells configured in this fashion will provide a memory unit that has a per functional memory cell width that is less than generally utilized memory units. As discussed above, commonly utilized memory configurations can provide a function memory cell width (the width that one memory cell and associated transistor(s) occupy) that is dictated by the width of the transistor, which can be estimated, based on the driving current necessary for RSM cells, to be about 5.6 F (with F being a factor based on the smallest width of features that can be fabricated). Embodiments of memory units disclosed herein can have functional memory cell widths that are less than 5.6 F. In embodiments, memory units disclosed herein can have functional memory cell widths that are not greater than about 4.0 F (about 80% of 5.6 F). In embodiments, memory units disclosed herein can have functional memory cell widths that are not greater than about 3.9

F (about 70% of 5.6 F). In embodiments, memory units disclosed herein can have functional memory cell widths that are not greater than about 3.4 F (about 60% of 5.6 F). In embodiments, memory units disclosed herein can have function memory cell widths that are about 3 F. In embodiments, memory units disclosed herein can have functional memory cell widths that are about 2.8 F.

Figure 2B:
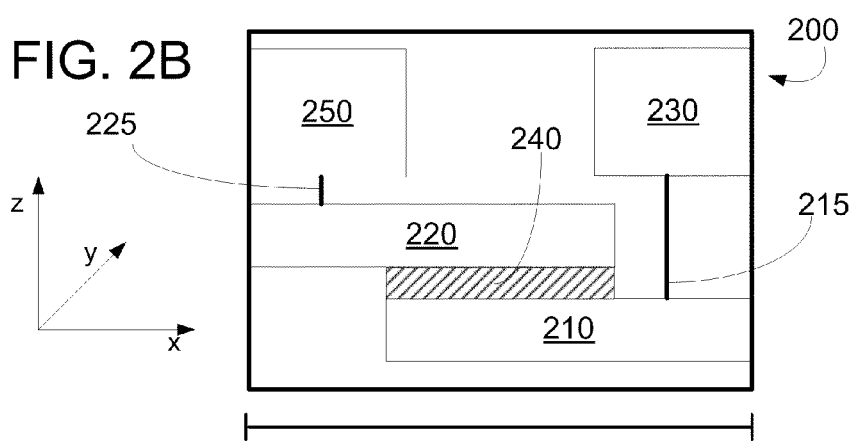
FIG. 2B is a schematic diagram of an embodiment of a memory unit that utilizes a single memory cell—single transistor configuration as disclosed herein.

Another exemplary embodiment is depicted in FIG. 2B. The embodiment depicted in FIG. 2B includes a first transistor 210, a second transistor 220, a first RSM cell 230, and a second RSM cell 250. The first transistor 210 is electrically coupled to the first RSM cell 230, which is depicted by the first electrical connection 215; and the second transistor 220 is electrically coupled to the second RSM cell 250, which is depicted by the second electrical connection 225. In embodiments, the first and second transistors 210 and 220 both include source and drain regions and the electrical connections 215 and 225 connect to the RSM cells 230 and 250 via the drain regions of the first and second transistors 210 and 220 respectively. In such an embodiment, each of the RSM cells is driven by its own single transistor. In embodiments, the first and second RSM cells 230 and 250 can be the same kind of RSM cells. In embodiments, the first and second RSM cells 230 and 250 can both be STRAM or can both be RRAM. In embodiments, the first and second transistors 210 and 220 can be the same kind of transistors. In embodiments, the first and second transistors 210 and 220 can be MOSFETs.

As seen in FIG. 2B, the memory unit 200 generally has three dimensions, as depicted by the x-axis, y-axis and z-axis. In embodiments, decreasing the length of the memory unit in either the x- or y-axes can serve to decrease the area taken up the memory unit. In embodiments, such as that depicted in FIG. 2B, decreasing the width of the memory unit in the x-dimension can serve to decrease the area taken up by the memory unit. As seen in FIG. 2B, this exemplary memory unit 200 has a length of x1 in the direction of the x-axis. In embodiments such as that disclosed in FIG. 2B, the width of the memory unit in the plane of the x-axis can generally be less than twice that of the width of commonly utilized memory configurations.

The exemplary memory unit 200 includes a first transistor 210 and a second transistor 220. The second transistor 220 is generally positioned above the first transistor 210 in the direction of the z-axis. The first transistor 210 generally has a width and spans a region (referred to as a first transistor region) in the plane of the x-axis within the memory unit. The second transistor 220 also has a width and spans a region (referred to as a second transistor region) in the plane of the x-axis within the memory unit. The second transistor region at least partially overlaps the first transistor region in the plane of the x-axis. This region is depicted in FIG. 2B and is referred to as the transistor overlap region 240. Stated differently, there is at least one cross section of the memory unit that can be taken through the plane defined by the z- and y-axes that will include both the first transistor 210 and the second transistor 220; and there can be, but need not be, at least one cross section that can be taken through the plane defined by the z- and y-axes that will include only one of the first transistor 210 or the second transistor 220.

The exemplary memory unit 200 also includes a first RSM cell 230 and a second RSM cell 250. Both the first and second RSM cells 230 and 250 are generally positioned above the second transistor 220 in the direction of the z-axis. Because the second transistor 220 is positioned above the first transistor 210 in the plane of the z-axis, the first and second RSM cells 230 and 250 are also positioned above the first transistor 210. The first RSM cell 230 generally has a width and spans a region (referred to as a first memory region) in the plane of the x-axis within the memory unit. The second RSM cell 250 also has a width and spans a region (referred to as a second memory region) in the plane of the x-axis within the memory unit. Neither the first memory region nor the second memory region extends beyond the first transistor region and the second transistor region. Stated differently, there is no cross section of the memory unit that can be taken through the plane defined by the z- and y-axes that will include either of the RSM cells 230 or 250 but will not include one or both of the first transistor or second transistor 210 or 220.

The first transistor 210 can be located in a first layer of the memory unit, the second transistor 220 can be located in a second layer of the memory unit, and the RMS cells 230 and 250 can be located in a third layer of the memory unit. Generally, the second layer is positioned between the first and third layers. The components being located in the three overlying layers, the transistor overlap region 240 of the first and second transistors, and the relatively smaller areas of the RSM cells (allowing two be positioned within the region taken up by a single transistor) allows this configuration to minimize the functional memory cell width.

Figure 2C:
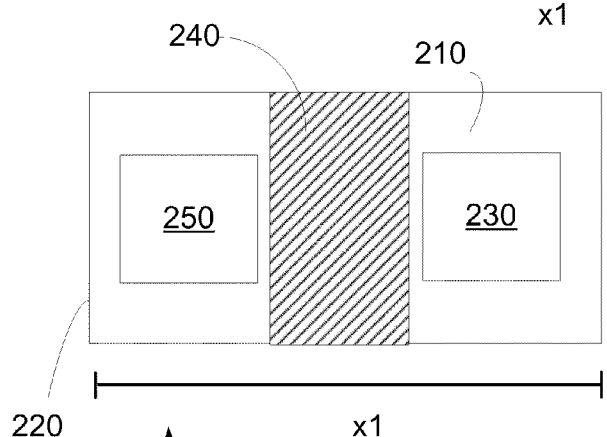
FIG. 2C is a perspective view of the memory unit depicted in FIG. 2B.

Another view of such a memory unit can be seen in FIG. 2C. It should be noted that the first and second electrical connections 215 and 225 are not shown in this view. The depiction in FIG. 2C could be considered a "top down" view of the memory unit depicted in FIG. 2B. This view shows the at least partial overlap of the first transistor 210 and the second transistor 220 in the plane of the x-axis as the transistor overlap region 240. This view also shows that the first memory region of the first RSM cell 230 and the second memory region of the second RSM cell 250 do not extend beyond the first transistor 210 and the second transistor 220 or more specifically, do not extend beyond the first transistor 210 and the second transistor 220 in the plane of the x-axis. It can be seen from this depiction that the more the two transistors overlap, i.e. the larger the transistor overlap region 240 the smaller the width x1 become, the more it approaches the width of a single transistor, and therefore, the smaller overall area of the memory unit.

Figure 2D:
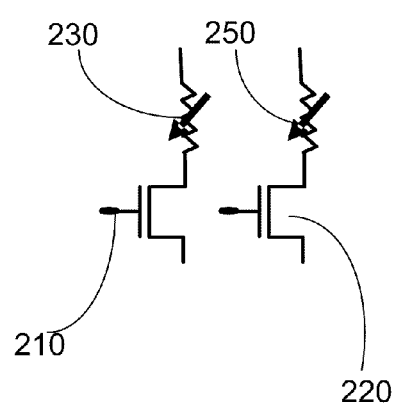
FIG. 2D is a circuit diagram of the memory unit depicted in FIG. 2B.

FIG. 2D depicts a circuit diagram for the configuration depicted in FIGS. 2B and 2C. The first transistor 210 is electrically connected to the first RSM cell 230; and the second transistor 220 is electrically connected to the second RSM cell 250. The positioning of the two transistors in the plane of the z-axis, the positioning of the two RSM cells above the width taken up by the two transistors, and the electrical connection of two separate transistors to two separate RSM cells affords a memory unit having a minimum function memory cell width (width that one memory cell and associated transistor(s) occupy) of about 2.8 F. In embodiments, the unit width can be greater than 2.8 F, but less than 5.6 F. In embodiments, the functional memory cell width may only approach 2.8 F because of metal routing, additional peripheral circuits, more complex decoding, other considerations, or a combination thereof.

Memory units as disclosed herein can be connected to other memory units, other electrical components, or both via electrical connections. In embodiments, electrical connections referred to as bit lines, source lines and word lines can be utilized to provide electrical connections to various portions of the memory unit. A memory unit that includes one of these (or another) electrical connections can mean that the memory unit is connected to such an electrical connection and the electrical connection can extend beyond the memory unit. Bit lines are generally utilized to make electrical connections to the RSM cells. Generally, bit lines are electrically connected to the top electrodes (or an equivalent structure) of the RSM cells. Source lines are generally utilized to make electrical connections to the transistors, thereby completing an electrical circuit through the transistor(s)/memory cell (when the transistor is turned on). Generally, source lines are electrically connected to the source (or equivalent structure) of the transistors. Word lines are generally utilized to turn the transistors on and off. Generally, word lines are electrically connected to the substrate (or equivalent structure) of the transistor or are within the substrate of the transistor.

Figure 3A:
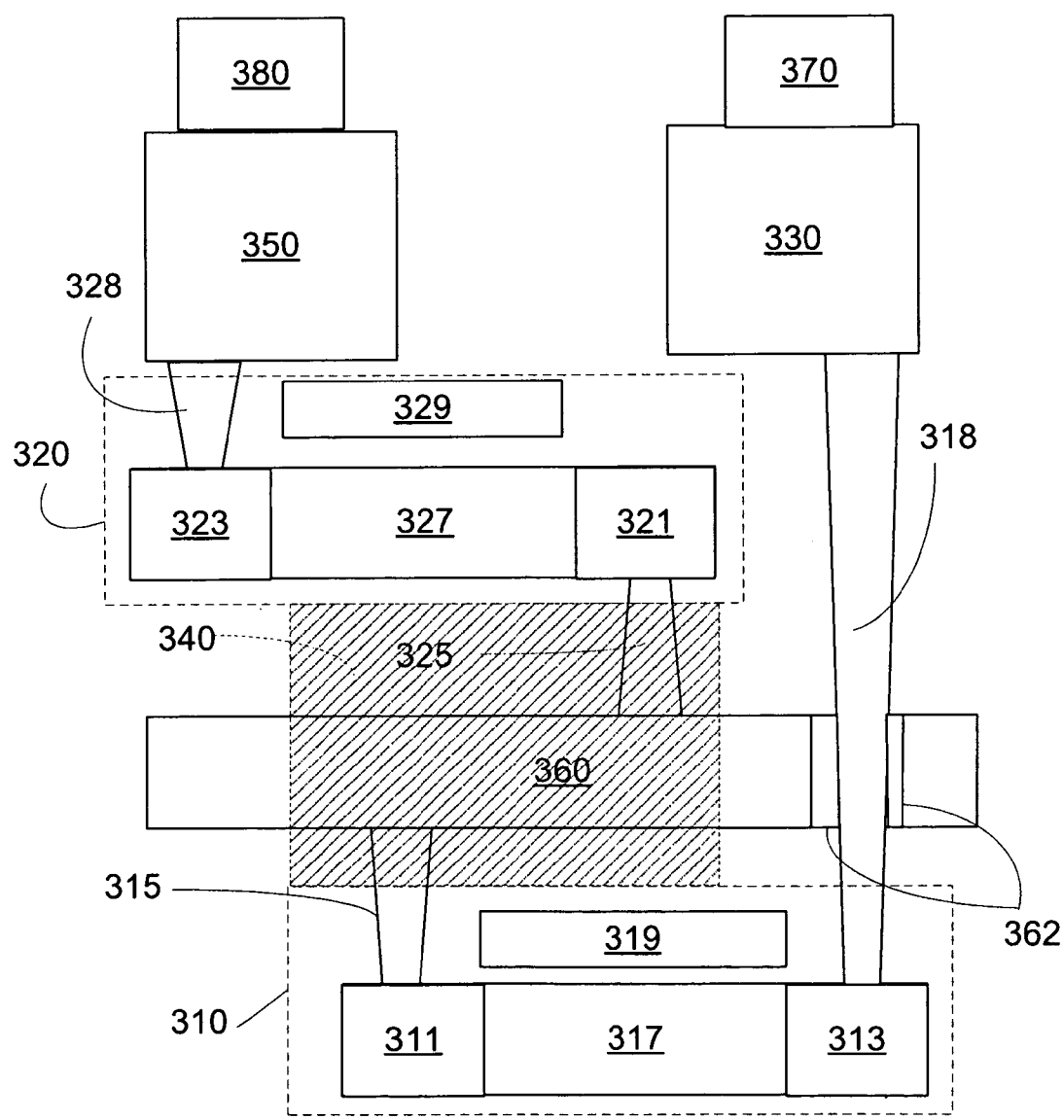
FIG. 3A is a schematic diagram of an embodiment of a memory unit that utilizes a single memory cell—single transistor configuration as disclosed herein.

FIG. 3A depicts a schematic illustration of an embodiment of a memory unit as disclosed herein. The depiction in FIG. 3A is not necessarily a cross section, as such a depiction may make it difficult to distinguish all of the various components. This exemplary embodiment includes a first transistor 310, a second transistor 320, a first RSM cell 330, and a second RSM cell 350 as discussed above. As seen here, the second transistor 320 is positioned above the first transistor 310 and at least partially overlaps the first transistor 310 at the transistor overlap region 340. The first and second RSM cells 330 and 350 are positioned above the second transistor 320 and do not extend beyond the first and second transistor 310 and 320.

The exemplary first and second transistors 310 and 320 utilized herein include source regions 311 and 321; drain regions 313 and 323; substrates 317 and 327; and gate regions 319 and 329. As seen in FIG. 3A, the source regions 311 and 321 and the drain regions 313 and 323 are configured oppositely. Stated differently, the first transistor 310 includes the source region 311 on the left of the first transistor 310 and the second transistor 320 includes the source region 321 on the right of the second transistor 320.

Also included in this depiction is a source line 360. As seen in FIG. 3A, the source line 360 is electrically connected, via a first source electrical connection 315 and a second source electrical connection 325 to the source regions 311 and 321 of the first and second transistor 310 and 320 respectively. The source line 360 is generally disposed between the first transistor 310 and the second transistor 320. The first RSM cell 330 is electrically connected to the drain region 313 of the first transistor 310 via a first drain electrical connection 318; and similarly, the second RSM cell 350 is electrically connected to the drain region 323 of the second transistor 320 via a second drain electrical connection 328.

As seen in FIG. 3A, a portion of the source line 360 is electrically insulated from the first drain electrical connection 318 by a via insulator 362. The via insulator 362 can be made of an electrically insulating material or can alternatively be a void of material (e.g. air can function as the insulator). Generally, the via insulator 362 encompasses the first drain electrical connection 318 wherever it would other wise contact the source line 360.

The embodiment depicted in FIG. 3A also includes a first bit line 370 and a second bit line 380. The first bit line 370 is electrically connected to the first RSM cell 330; and the second bit line 380 is electrically connected to the second RSM cell 350. Although not depicted herein, the electrical connection of the bit lines to the RSM cells can be accomplished via the top electrodes of the RSM cells.

Figure 3B:
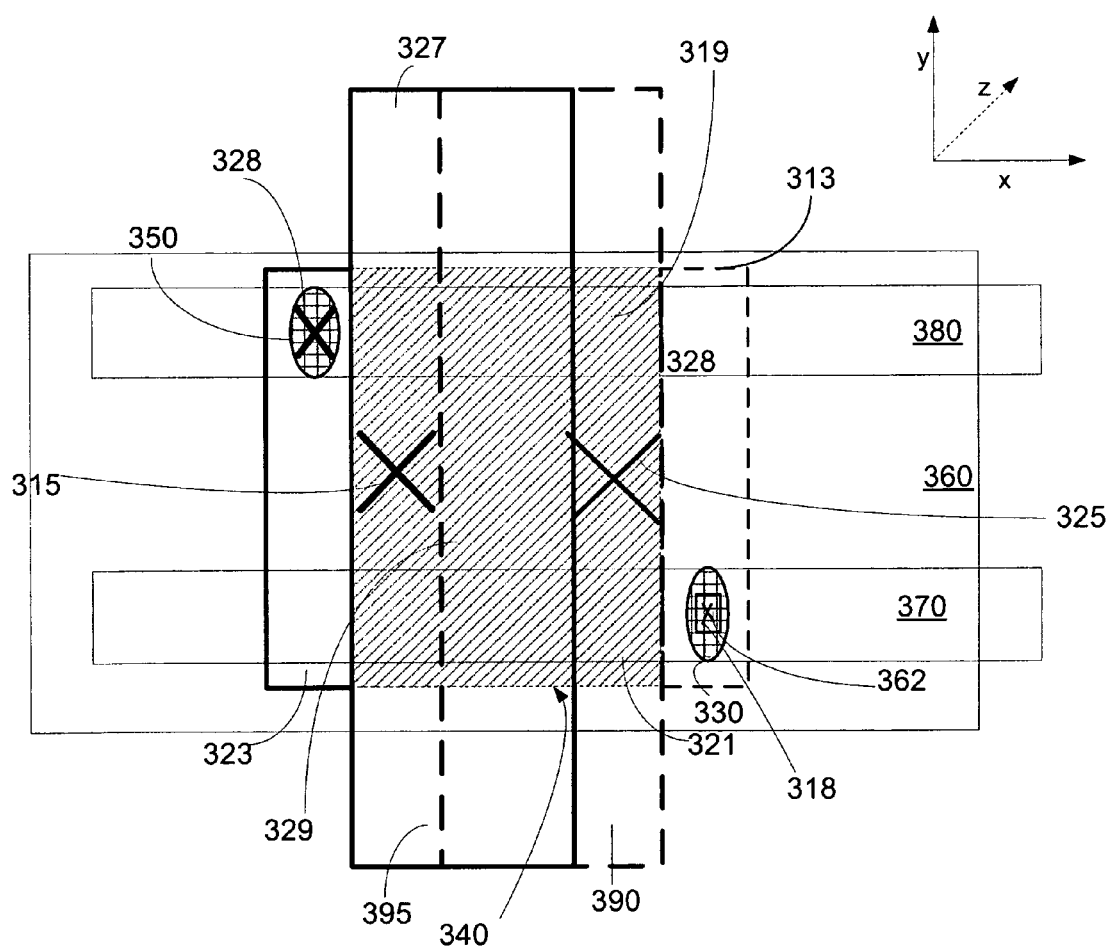
FIG. 3B is a schematic diagram from a different perspective of the memory unit depicted in FIG. 3A.

FIG. 3B illustrates a "top down" view of the memory unit depicted in FIG. 3A. Like components are numbered in the same fashion as FIG. 3A. The transistor overlap region 340 is depicted in dashed lines. As seen in FIG. 3B, the first bit line 370 and second bit line 380 are electrically connected to the first and second memory cell 330 and 350 respectively via first and second drain electrical connections 318 and 328. The via insulator 362 can also be seen in this view as isolating the first drain electrical connection 318 from the source line 360.

Also seen in this view are the first and second word lines 390 and 395. The word lines generally travel through, exist within, or are the first and second substrates 317 and 327 from FIG. 3A.

Figure 3C:
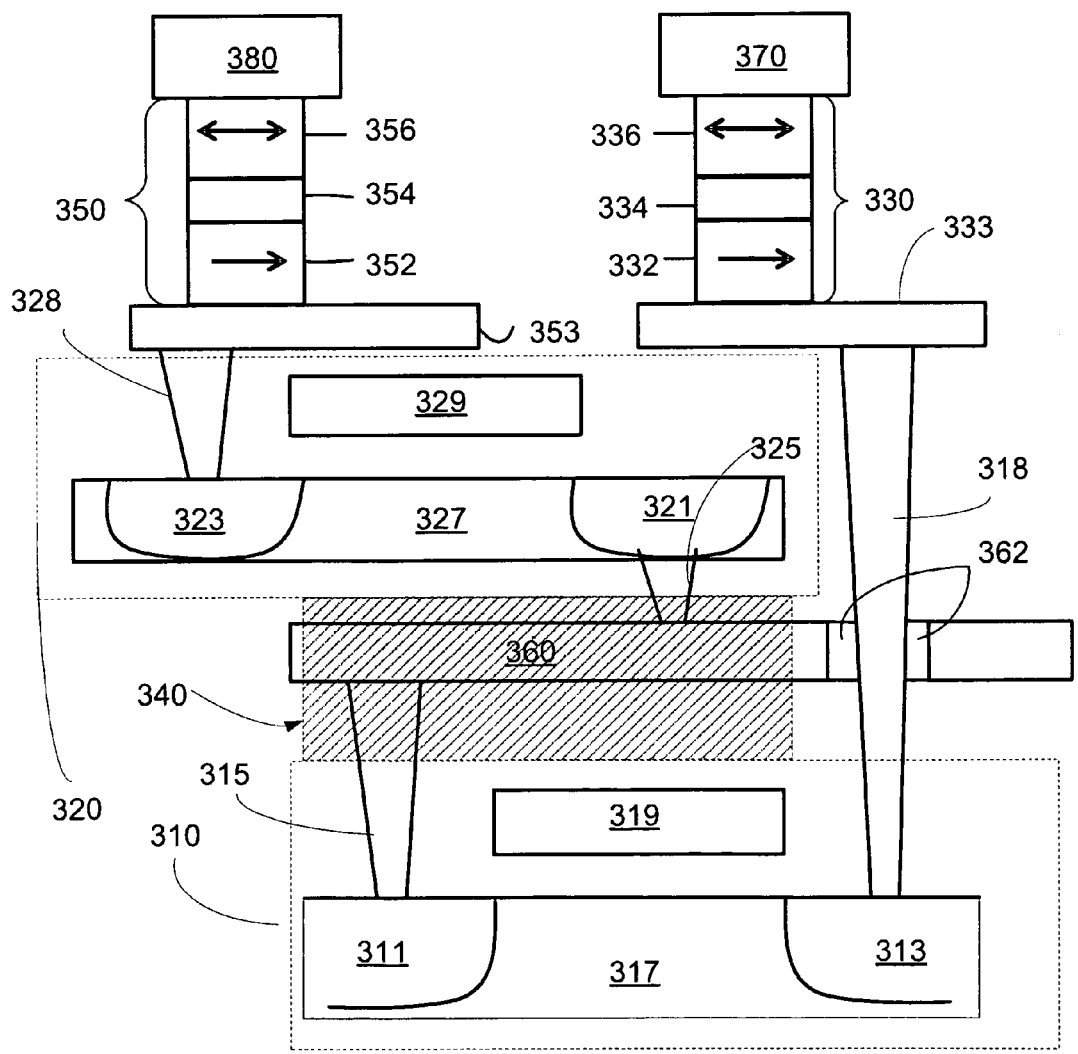
FIG. 3C is a schematic diagram of a memory unit that utilizes a STRAM single memory cell—single transistor.

FIG. 3C illustrates a schematic representation of another embodiment of a memory unit as disclosed herein. The memory unit depicted in FIG. 3C is similar to that depicted in FIGS. 3A and 3B, and like elements are numbered similarly. A number of the components of the embodiment depicted in FIG. 3C were also found in and discussed with respect to FIGS. 3A and 3B and will therefore not be discussed separately. The transistor overlap region 340 is again depicted in dashed lines. The embodiment depicted in FIG. 3C includes STRAM cells as the RSM cells. As seen in FIG. 3C, the RSM cells in this embodiment, the first RSM cell 330 and the second RSM cell 350 include multiple layers, pinned layers 332 and 352; tunnel junctions 334 and 354; and free layers 336 and 356. The tunnel junctions 334 and 354 are disposed between the pinned layers 332 and 335 and the free layers 336 and 338 respectively. The first and second RSM cells 330 and 350 include, or are electrically connected to first and second bottom electrodes 333 and 353. The first and second bottom electrodes 333 and 353 are then electrically connected via the first and second drain electrical connections 318 and 328 to the drains 313 and 323 of the first and second transistors 310 and 320 respectively.

Figure 4A:
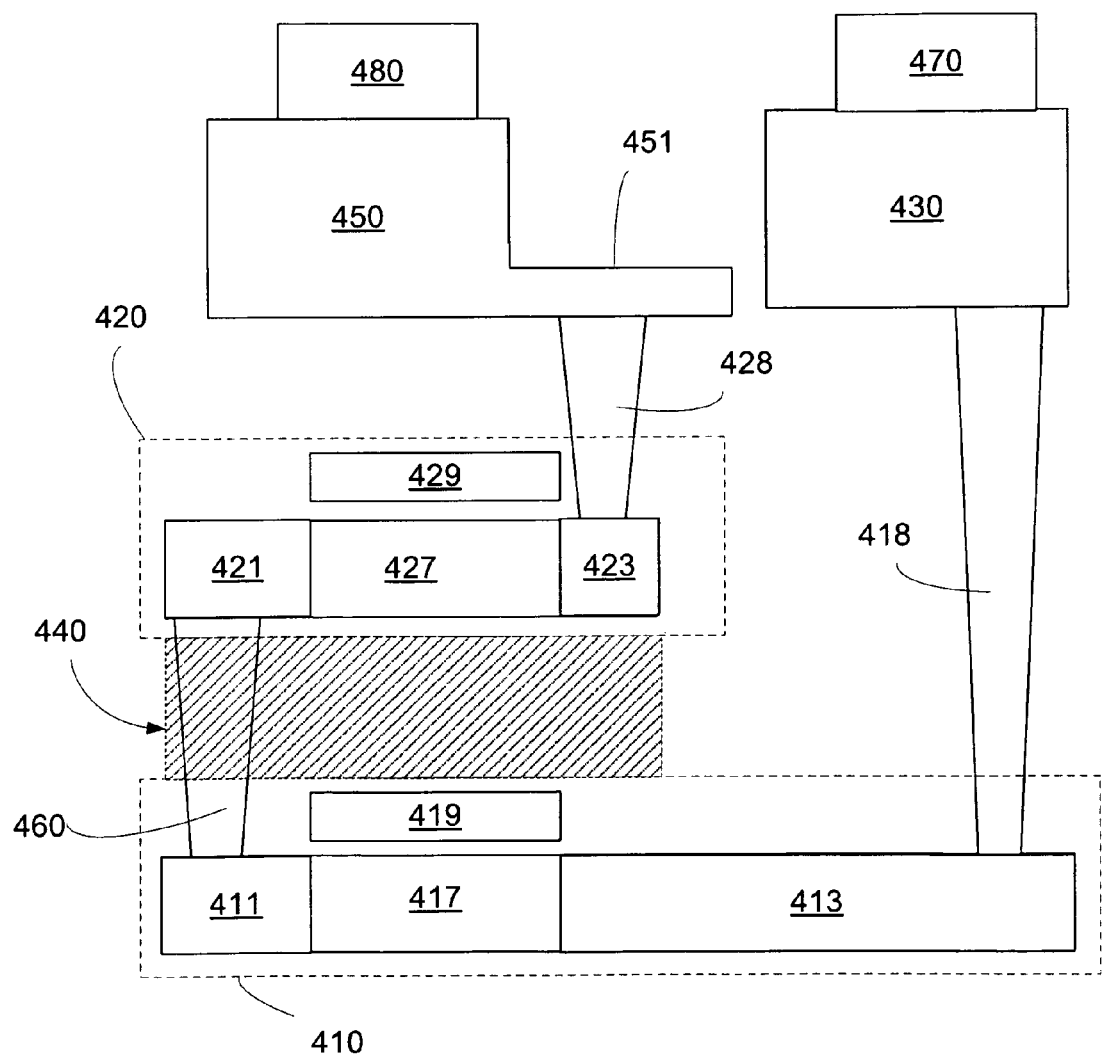
FIG. 4A is a schematic diagram of an embodiment of a memory unit that utilizes a single memory cell—single transistor configuration as disclosed herein.

FIG. 4A depicts a schematic illustration of another embodiment of a memory unit as disclosed herein. The depiction in FIG. 4A is not necessarily a cross section, as such a depiction may make it difficult to distinguish all of the various components. This exemplary embodiment includes a first transistor 410, a second transistor 420, a first RSM cell 430, and a second RSM cell 450 as discussed above. As seen here, the second transistor 420 is positioned above the first transistor 410 and at least partially overlaps the first transistor 410. As shown by the transistor overlap region 440 in dashed lines. The first and second RSM cells 430 and 450 are positioned above the second transistor 420 and do not extend beyond the first and second transistor 410 and 420.

As seen in FIG. 4A, the source regions 411 and 421 and the drain regions 413 and 423 have parallel configurations in the plane of the x-axis. Stated differently, the first transistor 410 includes the source region 411 on the left of the first transistor 410 and the second transistor 420 also includes the source region 421 on the left of the second transistor 420. In such embodiments, the transistors are not necessarily the same size. Specifically, the drain region 413 of the first transistor 410 can be larger than the drain region 423 of the second transistor 420. The drain region 413 of the first transistor 410 can extend farther in the plane of the x-axis than the drain region 423 of the second transistor 420. Other portions of the first transistor 410 can also, but need not, be larger than analogous portions of the second transistor 420. Such components allow the second transistor 420 to be positioned above the first transistor 410 while still allowing the first RSM cell 430 to be electrically connected to the first transistor 410 via the first drain electrical connection 418 without the need to electrically isolate the electrical connection from other structures it would progress through. This can provide advantages in that it may be more efficiently and/or more cost effectively produced, however it may have a slightly larger area overhead in comparison to other single memory cell—single transistor configurations.

The source line 460 in this embodiment is generally positioned between the first transistor 410 and the second transistor 420. In contrast to the embodiment depicted in FIG. 3A where separate electrical connection structures (first source electrical connection 315 and second source electrical connection 325) were provided to electrically connect the source regions 311 and 321 of the first and second transistors 310 and 320 to the source line 360, the source region 460 generally does not require a separate structure for electrical connection and can be formed to function as its own electrical connection to the source regions 411 and 421 of the first and second transistors 410 and 420. This can provide advantages to such a configuration as it may be more efficiently and/or more cost effectively produced.

As seen in FIG. 4A, the second RSM cell 450 can, but need not, have a structure (or an operatively coupled additional element) that is different than that of the first RSM cell 430. In embodiments, the second RSM cell 450 can have a bottom electrode 451 that extends beyond the remainder of the second RSM cell 450. One of skill in the art will understand, having read this specification, that the layout of individual components, such as the bottom electrode 451 for example, can be tailored to conserve area.

Figure 4B:
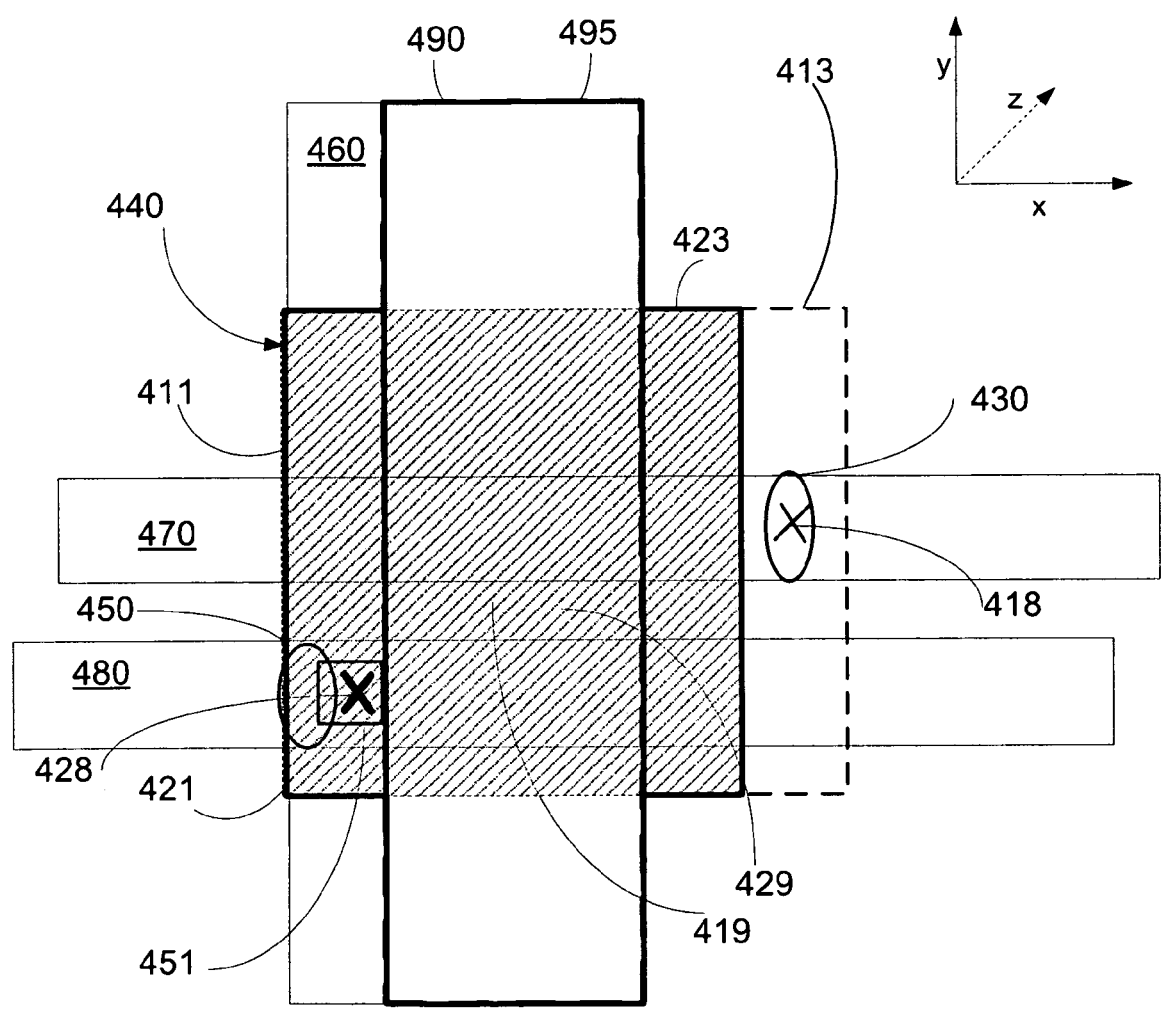
FIG. 4B is a schematic diagram from a different perspective of the memory unit depicted in FIG. 4A.

FIG. 4B illustrates a "top down" view of the memory unit depicted in FIG. 4A. Like components are numbered in the same fashion as FIG. 4A. As seen in FIG. 4B, the first bit line 470 and second bit line 480 are electrically connected to the first and second memory cell 430 and 450 respectively via first and second drain electrical connections 418 and 428. FIG. 4B shows that the bottom electrode 451 of the second RSM cell 450 provides electrical connection via the second drain electrical connection 428 to the second bit line 480. Also seen in this view are the first and second word lines 490 and 495. Although not distinguishable in FIG. 4B, based on the second transistor 420 being positioned directly above the first transistor, the second word line 495 would also be positioned above the first word line 490 and would generally travel through, exist within, or are the first and second substrates 417 and 427 from FIG. 4A. The transistor overlap region 440 is again shown in dashed lines.

Figure 4C:
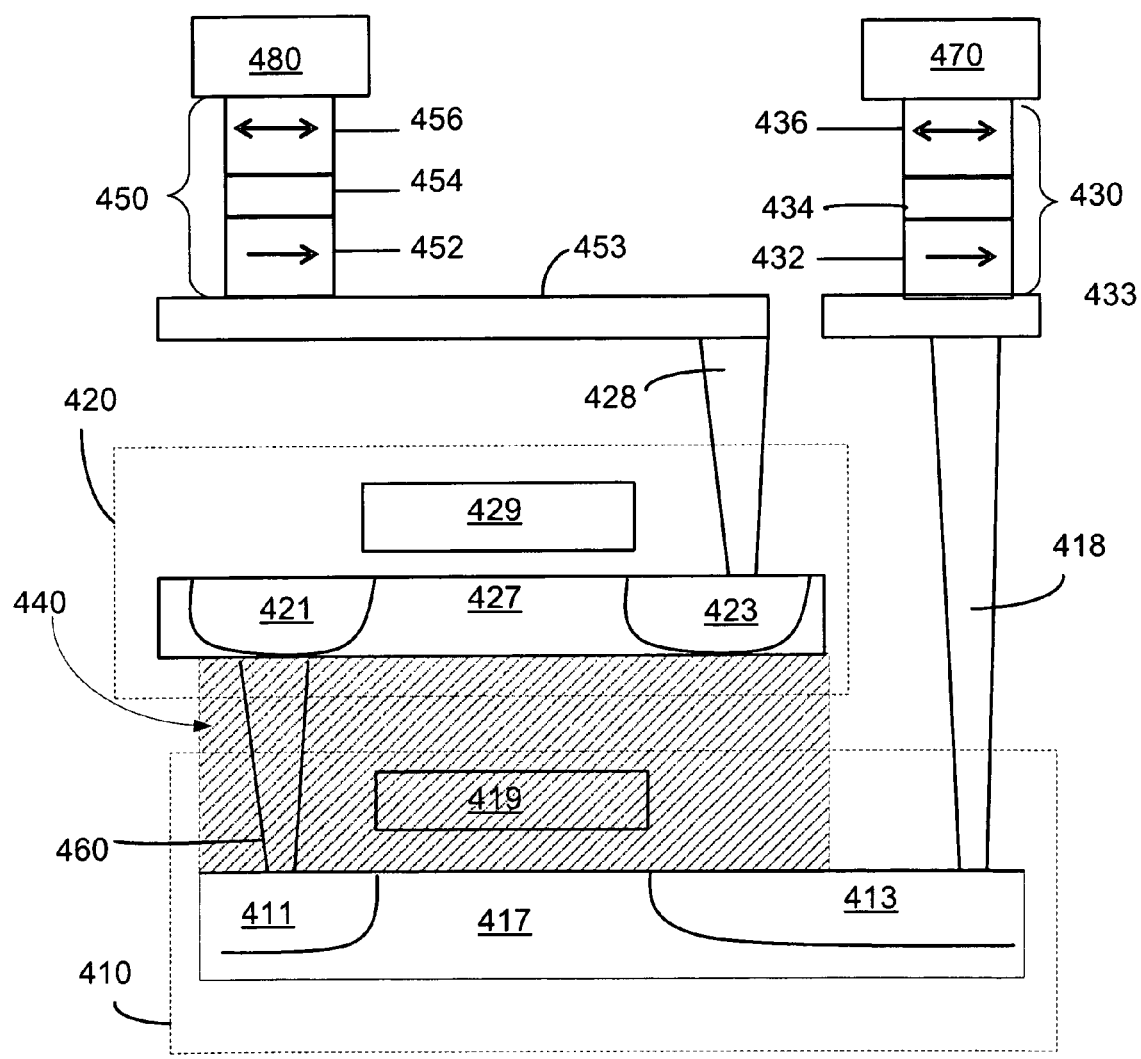
FIG. 4C is a schematic diagram of a memory unit that utilizes a STRAM single memory cell—single transistor.

FIG. 4C illustrates a schematic representation of another embodiment of a memory unit as disclosed herein. The memory unit depicted in FIG. 4C is similar to that depicted in FIGS. 4A and 4B, and like elements are numbered similarly. A number of the components of the embodiment depicted in FIG. 4C were also found and discussed with respect to FIGS. 4A and 4B and will therefore not be discussed separately. The embodiment depicted in FIG. 4C includes STRAM cells as the RSM cells. As seen in FIG. 4C, the RSM cells in this embodiment, the first RSM cell 430 and the second RSM cell 450, include pinned layers 432 and 452, tunnel junction layers 434 and 454 and free layers 436 and 456 as discussed with respect to FIG. 3C. The first and second RSM cells 430 and 450 include, or are electrically connected to first and second bottom electrodes 433 and 453. As seen in this exemplary embodiment, the second bottom electrode 453 can be larger than the first bottom electrode 433. The transistor overlap region 440 is again shown in dashed lines.

Figure 5A:
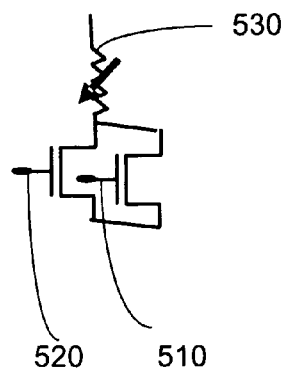
FIG. 5A is a circuit diagram for a memory unit that utilizes a single memory cell—double transistor configuration.

Another embodiment of a memory unit as disclosed herein, is one that electrically connects a single RSM cell to a transistor that is electrically connected (in serial) to another transistor. FIG. 5A depicts a circuit diagram for such a configuration. The first transistor 510 is electrically connected to the second transistor 520. The first transistor 510 and the second transistor 520 can generally have a smaller width than commonly utilized transistors because they are parallely connected so the two transistors have a width of only half of conventionally utilized transistor. Although the two transistors require only half the area on the substrate, they are able to provide the same driving capability spread over two vertical layers. The RSM cell 530 is then electrically connected to the second transistor 520. The positioning of the two transistors, one above the other (explained further with respect to FIGS. 5B, 5C, 5D and 5E) and the RSM cell above the width taken up by the two transistors affords a memory unit having a functional memory cell width (width that one memory cell and associated transistor(s) occupy) of about 2.8 F. In embodiments, the unit width can be greater than 2.8 F, but less than 5.6 F. In embodiments, the functional memory cell width may only approach 2.8 F because of metal routing, additional peripheral circuits, more complex decoding, other considerations, or a combination thereof.

Figure 5B:
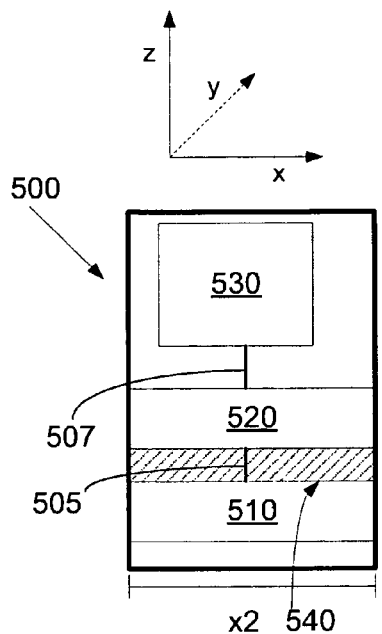
FIG. 5B is a schematic diagram of such a memory unit.

Another embodiment of a memory unit is schematically depicted in FIG. 5B. The memory unit generally has three dimensions, as depicted by the x-axis, y-axis and z-axis. The memory unit 500 includes a first transistor 510, a second transistor 520 and a first RSM cell 530. The first transistor 510 is electrically connected to the second transistor 520 via a transistor connection 505. The transistor connection 505 allows the first and second transistors 510 and 520 to function as a single transistor with respect to the RSM unit. The second transistor 520 is electrically connected to the RSM unit 530 via the memory connection 507. The memory connection 507 allows both the first transistor and the second transistor to drive (together) the RSM cell 530.

As seen in FIG. 5B, the memory unit 500 generally has a width in the plane of the x-axis of x2. Generally, x2 is less than the length of commonly utilized transistors. The exemplary memory unit 500 includes a first transistor 510 and a second transistor 520. The second transistor 520 is generally positioned above the first transistor 510 in the direction of the z-axis. The first transistor 510 generally has a width and spans a region (referred to as a first transistor region) in the plane of the x-axis within the memory unit. The second transistor 520 also has a width and spans a region (referred to as a second transistor region) in the plane of the x-axis within the memory unit. The second transistor region at least partially overlaps the first transistor region in the plane of the z-axis. In embodiments, the second transistor region substantially overlaps the first transistor region in the plane of the z-axis. In embodiments, the first transistor 510 and the second transistor 520 generally have substantially similar widths in the plane of the x-axis and are substantially overlapping in the direction of the z-axis. In embodiments, the first transistor 510 and the second transistor 520 generally have the same widths in the direction of the x-axis and entirely overlap in the plane of the z-axis. The transistor overlap region 540 is shown in FIG. 5B.

The exemplary memory unit 500 also includes a RSM cell 530. The RSM cell 530 is generally positioned above the second transistor 520. Because the second transistor 520 is positioned above the first transistor 510, the RSM cell 530 is also generally positioned above the first transistor 510. The RSM cell 530 generally has a width and spans a region (referred to as a memory region) in the plane of the x-axis within the memory unit. The first memory region does not extend beyond the first transistor region and the second transistor region. Stated differently, there is no cross section of the memory unit that can be taken through the plane defined by the z- and y-axes that will include the RSM cell 530 but will not include one or both of the first transistor or second transistor 510 or 520. In embodiments, there is no cross section of the memory unit that can be taken through the plane defined by the z- and y-axes that will include the RSM cell 530 but will not both the first transistor and the second transistor 510 and 520.

In embodiments, the first and second transistors 510 and 520 both include source and drain regions and the transistor electrical connection 505 can include two separate electrical connections. One portion of the transistor connection 505 connects the source of the first transistor 510 to the source of the second transistor 520; and the other portion connects the drain of the first transistor 510 to the drain of the second transistor 520. In such an embodiment, the memory connection 507 can electrically connect the drain of the second transistor 520 to the RSM cell 530. In embodiments, the RSM cells 530 can be a STRAM cell or a RRAM cell. In embodiments, the first and second transistors 510 and 520 can be the same kind of transistors. In embodiments, the first and second transistors 510 and 520 can be MOSFETs.

Figure 5C:
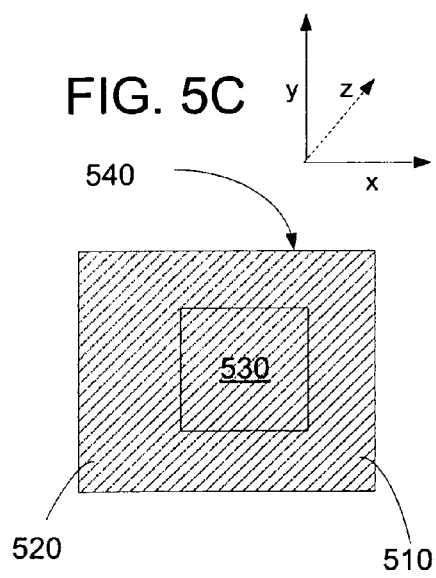
FIG. 5C is a schematic diagram from a different perspective of the memory unit depicted in FIG. 5B.

FIG. 5C could be considered a "top down" view of the memory unit depicted in FIG. 5B. It should be noted that the transistor connection 505 and memory connection 507 are not shown in this view. In the embodiment depicted in FIG. 5C, the first and second transistors 510 and 520 have substantially similar dimensions and therefore substantially entirely or entirely overlap in the height direction (e.g. the plane of the z-axis), with the second transistor 520 being positioned above the first transistor 510. As seen in FIG. 5C, the transistor overlap region 540 is contiguous with the two transistors because they are substantially similar in dimensions. It should be noted that the two transistors in such an embodiment need not be substantially similar. The RSM cell 530 is positioned above and within the perimeter of both the first and second transistors 510 and 520.

Figure 5D:
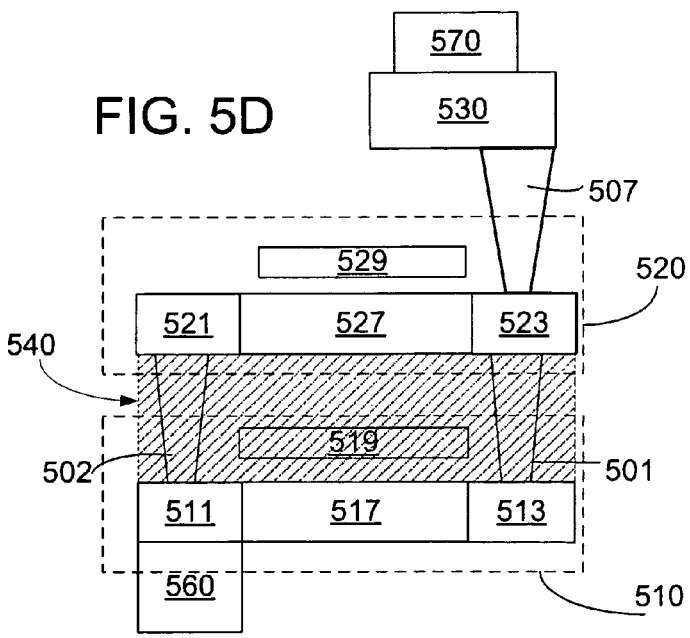
FIG. 5D is a schematic diagram of an embodiment of a memory unit that utilizes a single memory cell—double transistor configuration as disclosed herein.

FIG. 5D depicts a schematic illustration of an embodiment of a memory unit as disclosed herein. The depiction in FIG. 5D is not necessarily a cross section. This exemplary embodiment includes a first transistor 510, a second transistor 520, and a RSM cell 530 as discussed above. As seen here, the second transistor 520 is positioned above the first transistor 510 and at least partially overlaps the first transistor 510. The at least partial overlap is demonstrated by the transistor overlap region 540. The RSM cell 530 is positioned above the second transistor 520 and does not extend beyond the first and second transistors 510 and 520.

The exemplary first and second transistors 510 and 520 utilized herein include source regions 511 and 521; drain regions 513 and 523; substrates 517 and 527; and gate regions 519 and 529. As seen in FIG. 5D, the source regions 511 and 521 and the drain regions 513 and 523 have a parallel configuration. Stated differently, both the first transistor 510 and the second transistor 520 include the source regions 511 and 521 on the left of the transistors and the drain regions 513 and 523 on the right (or vice versa). The source region 511 of the first transistor 510 is electrically connected to the source region 521 of the second transistor 520 by the source electrical connection 502; and the drain region 513 of the first transistor 510 is electrically connected to the drain region 523 of the second transistor 520 by the drain electrical connection 501. Together the source electrical connection 502 and the drain electrical connection 501 form the transistor connection (referred to in FIG. 5B as element 505).

Also included in this depiction is a source line 560. As seen in FIG. 5D, the source line 560 is electrically connected to the source region 511 of the first transistor 510. The source line 560 is generally disposed below the first transistor 510. The embodiment depicted in FIG. 5D also includes a bit line 570. The bit line 570 is electrically connected to the RSM cell 530. Although not depicted herein, the electrical connection of the bit line to the RSM cells can be accomplished via a top electrode of the RSM cell.

Figure 5E:
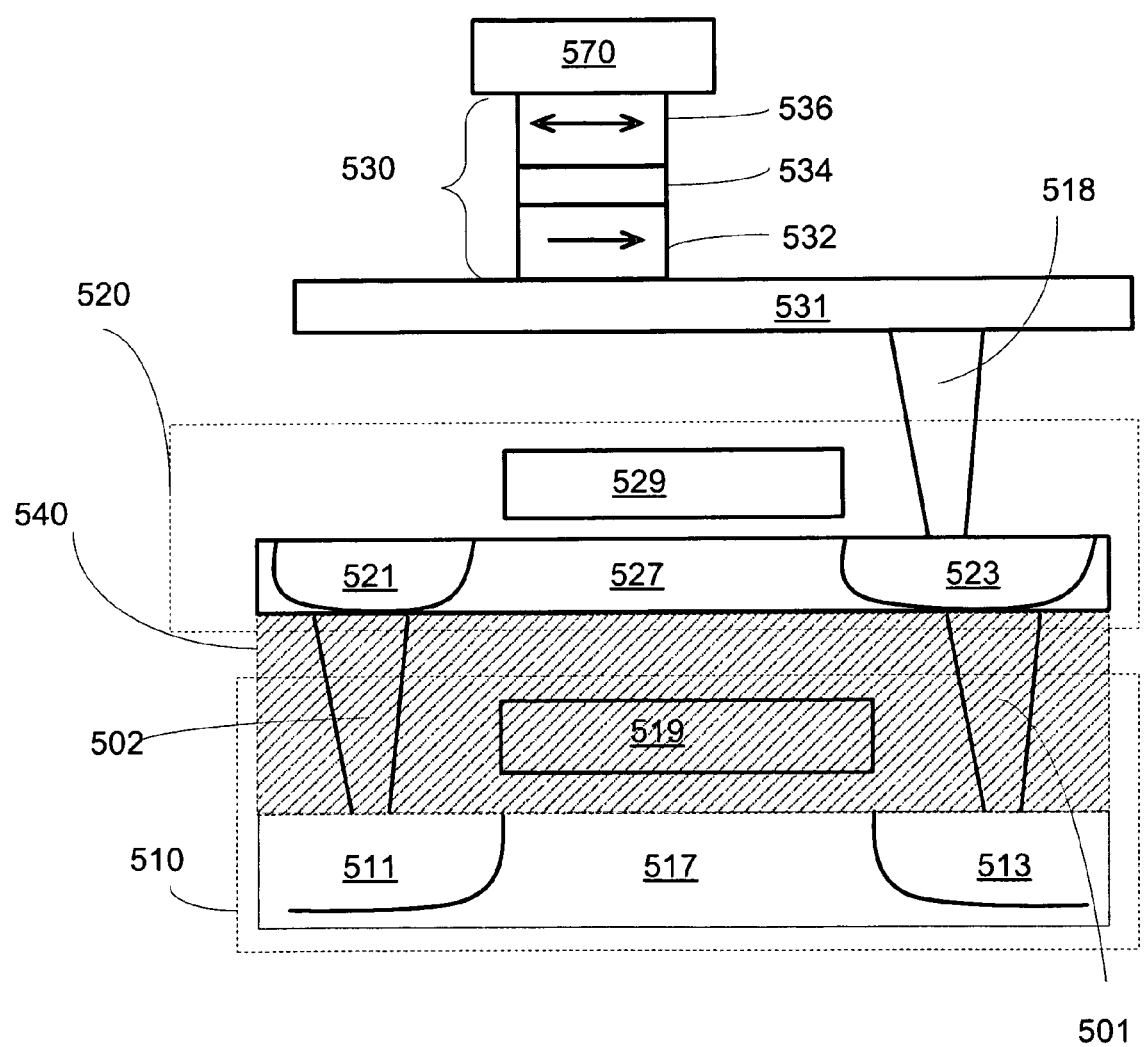
FIG. 5E is a schematic diagram of a memory unit that utilizes a STRAM single memory cell—double transistor configuration.

FIG. 5E illustrates a schematic representation of another embodiment of a memory unit as disclosed herein. The memory unit depicted in FIG. 5E is similar to that depicted in FIGS. 5B, 5C, and 5D, and like elements are numbered similarly. The at least partial overlap is demonstrated by the transistor overlap region 540. A number of the components of the embodiment depicted in FIG. 5E were also found and discussed with respect to FIGS. 5B, 5C, and 5D and will therefore not be discussed separately. The embodiment depicted in FIG. 5E includes a STRAM RSM cell. As seen in FIG. 5E, the RSM cell 530 includes a pinned layer 532, a tunnel junction layer 534, and a free layer 536 as discussed above with respect to FIG. 3C. The RSM cell 530 includes, or is electrically connected to a bottom electrode 531.

Figure 5F:
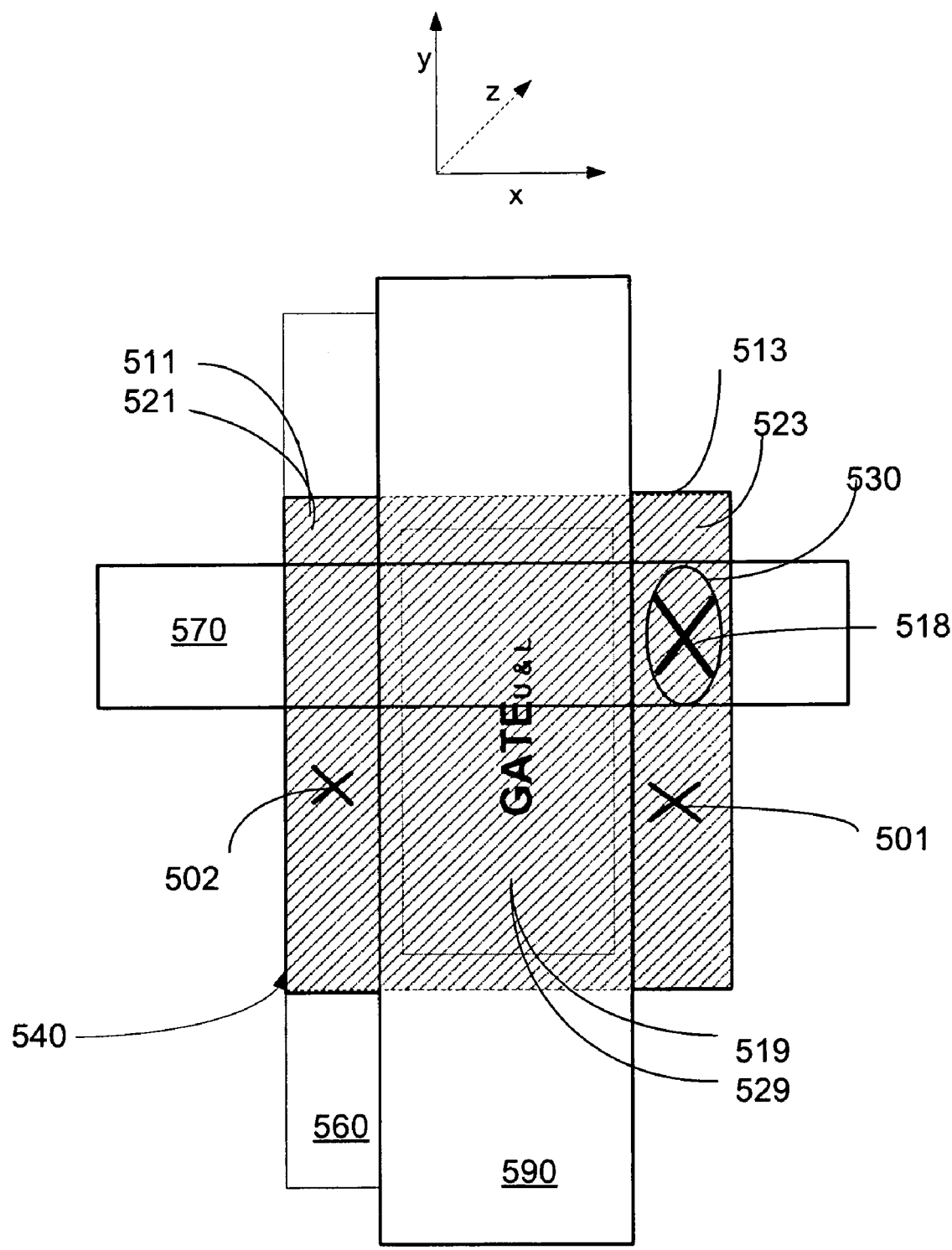
FIG. 5F is a schematic diagram from a different perspective of the memory unit depicted in FIG. 5D.

FIG. 5F illustrates a "top down" view of the memory unit depicted in FIG. 5E. Like components are numbered in the same fashion as FIG. 5E. Again, the transistor overlap region 540 is shown in dashed line. As seen in FIG. 5F, the bit line 570 is electrically connected to the RSM cell 530 via memory connection 518. Also seen in this view is the word line 590. Although there are two transistors in this memory unit, there is only one word line 590 because the transistors are controlled as if they were a single transistor. The word line 590 generally travels through, exists within, or is the first substrate 517 (seen in FIG. 5E).

Figure 6:
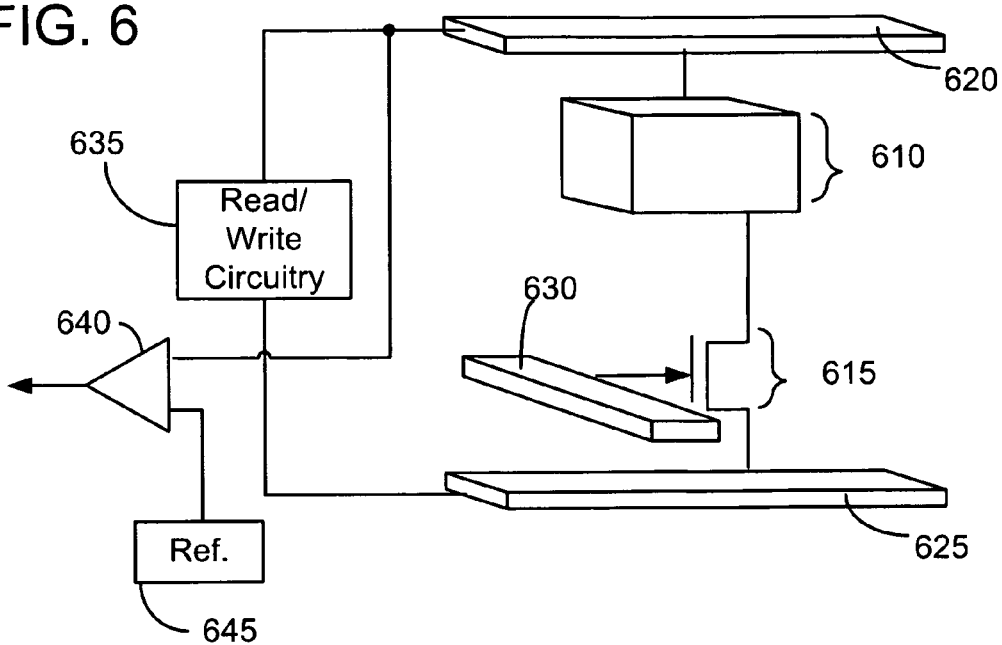
FIG. 6 is a schematic diagram of an embodiment of a portion of a memory unit configured with other elements to access the memory cell.

The memory units disclosed herein that electrically connect a single transistor to a single RSM cell can be utilized to store "data" as is generally known. FIG. 6 illustrates a system that includes a portion of a memory unit as disclosed herein that can include a RSM cell 610 and its associated (or electrically connected) transistor 615. Each portion of such a memory unit is configured (in a three dimensional space) with a second portion as discussed above to offer a memory unit that provides a small functional memory cell width. The RSM cell 610 and its electrically connected transistor 615 are operatively coupled between a bit line 620 and a source line 625. The read/write circuitry 635 controls which bit line 620 and source line 625 that current is passed through to read or write. The read/write circuitry 635 can also control the voltage applied across the bit line 620 from the source line 625 (or vice versa). The direction which current flows across a memory cell 610 is determined by the voltage differential across the bit line 620 and the source line 625.

A particular memory cell 610 can be read from by activating its corresponding transistor 615, which when turned on, allows current to flow from the bit line 620 through the memory cell 610 to the source line 625 (or vice versa). The transistor 615 is activated and deactivated through the word line 630. The word line 630 is operatively coupled to and supplies a voltage to the transistor 615 to turn the transistor on so that current can flow to the memory cell 610. A voltage, dependent on the resistance of the memory cell 610, is then detected by the sense amplifier 640 from the source line 625 (for example). The voltage differential between the bit line 620 and the source line 625 (or vice versa), which is indicative of the resistance of the memory cell 610 is then compared to a reference voltage 645 and amplified by the sense amplifier 640 to determine whether the memory cell 610 contains a "1" or a "0".

Embodiments of single memory cell—double transistor configurations of memory units disclosed herein (such as those described with respect to FIGS. 5A through 5F) can be utilized differently than other commonly utilized memory units. However, it should also be noted that such embodiments could also be utilized as described with respect to FIG. 6. The current necessary to determine the resistance state (read data) of a RSM cell is less than the current necessary to change the resistance state (write data) of the RSM cell. In embodiments where two transistors are electrically connected to function as one transistor, only one transistor needs to be turned on in order to determine the resistance state (i.e.

read data) of the RSM cell. In embodiments, only the first transistor can be turned on to determine the resistance state of the RSM cell. In embodiments, use of the first transistor for the read operation can make the decoding circuitry less complex. In embodiments, both the first and second transistor can be turned on to set the resistance state of the RSM cell.

Figure 7:
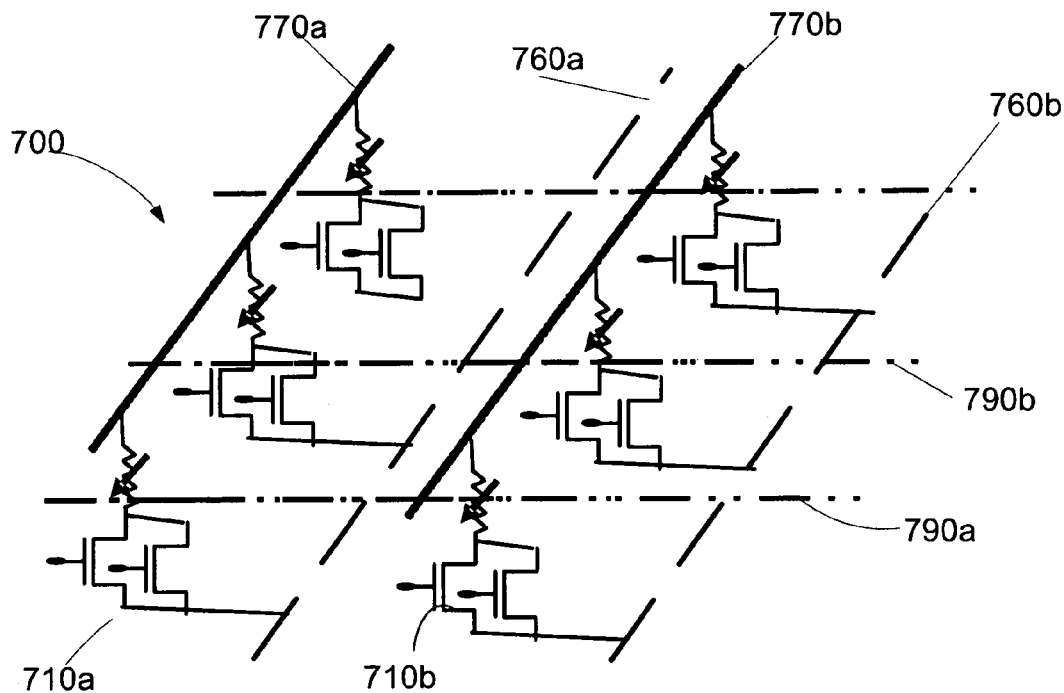
FIG. 7 is a schematic perspective view of an exemplary memory array including memory units as disclosed herein.

FIG. 7 depicts an exemplary memory array 700 that includes a plurality of memory units 710a and 710b as disclosed herein. The configuration seen in the memory array 700 is for memory units that include a single RSM cell electrically connected to a first and second transistor (such as that depicted in FIGS. 5A through 5F). However, one of skill in the art, having read this specification, will understand that the other embodiments disclosed herein can also be configured in a three dimensional array. Generally, a plurality refers to at least two and generally refers to more than two. The array 700 exemplified in FIG. 7 depicts six (6) memory units, but it will be understood that more or less than that depicted herein can be utilized. As seen in FIG. 7, each of the memory units 710a and 710b can be electrically connected in various manners and configurations by word lines 790a and 790b, source lines 760a and 760b, bit lines 770a and 770b, or a combination thereof. Other configurations utilized arrays of memory units disclosed herein are also envisioned.

Memory devices as discussed herein can be utilized in various applications and can generally be utilized in computer systems such as a PC (e.g., a notebook computer; a desktop computer), a server, or it may be a dedicated machine such as cameras, and video or audio playback devices.

Thus, embodiments of THREE DIMENSIONALLY STACKED NON VOLATILE MEMORY UNITS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A memory unit comprising;
   a first transistor spanning a first transistor region in a first layer of the memory unit;
   a second transistor spanning a second transistor region in a second layer of the memory unit;
   a first RSM cell spanning a first memory region in a third layer of the memory unit; and
   a second RSM cell spanning a second memory region in the third layer of the memory unit,
   wherein the first transistor is electrically coupled to the first RSM cell, and the second transistor is electrically coupled to the second RSM cell,
   wherein the second layer is between the first and third layers,
   wherein the first and second transistor have an transistor overlap region, and
   wherein the first memory region and the second memory region do not extend beyond the first transistor region and the second transistor region.

2. The memory unit according to claim 1, wherein the first transistor comprises a source region and a drain region, and the drain region of the first transistor is electrically coupled to the first RSM cell via a first drain electrical connection.

3. The memory unit according to claim 2, wherein the second transistor comprises a source region and a drain region and the drain region of the second transistor is electrically coupled to the second RSM cell.

4. The memory unit according to claim 1 further comprising a first bit line and a second bit line, wherein the first RSM cell is electrically coupled to the first bit line and the second RSM cell is electrically coupled to the second bit line.

5. The memory unit according to claim 3, wherein the source and drain regions of the first transistor and the second transistor are configured oppositely.

6. The memory unit according to claim 5 further comprising a source line disposed between the first layer and the second layer of the memory unit, wherein the first transistor and the second transistor are separately electrically connected to the source line.

7. The memory unit according to claim 6 further comprising a via insulator to electrically insulate the first drain electrical connection from the source line.

8. The memory unit according to claim 3, wherein the source and the drain regions of the first transistor and the second transistor have parallel configurations.

9. The memory unit according to claim 8, wherein the drain region of the first transistor is larger than the drain region of the second transistor.

10. The memory unit according to claim 8 further comprising a source line disposed between the first transistor and the second transistor, wherein the source line electrically connects the first transistor and the second transistor.

11. The memory unit according to claim 1, wherein the memory unit has a functional memory cell width of less than about 5.6 F.

12. The memory unit according to claim 1, wherein the memory unit has a functional memory cell width of not greater than about 3 F.

13. The memory unit according to claim 1, wherein the first and second RSM cells are spin torque transfer random access memory (STRAM) cells.

14. The memory unit according to claim 1, wherein the first and second RSM cells are resistive random access memory (RRAM) cells.

* * * * *